(12) United States Patent
Dellas et al.

(10) Patent No.: US 12,532,493 B2
(45) Date of Patent: Jan. 20, 2026

(54) TRANSISTOR WITH BUFFER STRUCTURE HAVING CARBON DOPED PROFILE

(71) Applicant: Texas Instruments Incorporated, Dallas, TX (US)

(72) Inventors: Nicholas Stephen Dellas, Dallas, TX (US); Dong Seup Lee, McKinney, TX (US); Andinet Tefera Desalegn, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 735 days.

(21) Appl. No.: 18/048,167

(22) Filed: Oct. 20, 2022

(65) Prior Publication Data

US 2023/0068191 A1 Mar. 2, 2023

Related U.S. Application Data

(62) Division of application No. 17/110,811, filed on Dec. 3, 2020, now Pat. No. 11,508,830.

(51) Int. Cl.
| | |
|---|---|
| *H10D 30/01* | (2025.01) |
| *H01L 21/02* | (2006.01) |
| *H10D 30/47* | (2025.01) |
| *H10D 62/10* | (2025.01) |
| *H10D 62/824* | (2025.01) |
| *H10D 62/854* | (2025.01) |
| *H10D 62/85* | (2025.01) |

(52) U.S. Cl.
CPC ..... *H10D 30/015* (2025.01); *H01L 21/02381* (2013.01); *H01L 21/02458* (2013.01); *H01L 21/02488* (2013.01); *H01L 21/02505* (2013.01); *H01L 21/0254* (2013.01); *H01L 21/0257* (2013.01); *H01L 21/0262* (2013.01); *H10D 30/475* (2025.01); *H10D 62/113* (2025.01); *H10D 62/824* (2025.01); *H10D 62/854* (2025.01); *H10D 62/8503* (2025.01)

(58) Field of Classification Search
None
See application file for complete search history.

(56) References Cited

U.S. PATENT DOCUMENTS

| | | | |
|---|---|---|---|
| 9,608,075 B1 | 3/2017 | Wan et al. | |
| 2014/0015608 A1 | 1/2014 | Kotani et al. | |
| 2019/0319111 A1 | 10/2019 | Suh et al. | |
| 2020/0161461 A1 | 5/2020 | Lee et al. | |
| 2020/0185499 A1 | 6/2020 | Lee et al. | |
| 2023/0068191 A1* | 3/2023 | Dellas | H01L 21/02488 |

* cited by examiner

*Primary Examiner* — Jack S Chen
(74) *Attorney, Agent, or Firm* — Yudong Kim; Frank D. Cimino

(57) ABSTRACT

In a described example, an integrated circuit (IC) is disclosed that includes a transistor. The transistor includes a substrate, and a buffer structure overlying the substrate. The buffer structure has a first buffer layer, a second buffer layer overlying the first buffer layer, and a third buffer layer overlying the second buffer layer. The first buffer layer has a first carbon concentration, the second buffer layer has a second carbon concentration lower than the first carbon concentration, and the third buffer layer has a third carbon concentration higher than the second carbon concentration. An active structure overlies the buffer structure.

20 Claims, 6 Drawing Sheets

TRANSISTOR WITH BUFFER STRUCTURE HAVING CARBON DOPED PROFILE

CROSS-REFERENCE TO RELATED APPLICATIONS

The present application is a division of U.S. patent application Ser. No. 17/110,811, filed on Dec. 3, 2020, which is incorporated herein by reference.

TECHNICAL FIELD

This description relates to a transistor with a buffer structure having a carbon doped profile.

BACKGROUND

Gallium-nitride (GaN) is a commonly used Group IIIA-N material for electronic devices, where Group IIIA elements such as Ga (as well as boron, aluminum, indium, and thallium) are also sometimes referred to as Group 13 elements. GaN is a binary Group IIIA/V direct band gap semiconductor that has a Wurtzite crystal structure. Its relatively wide band gap of 3.4 eV at room temperature (vs. 1.1 eV for silicon at room temperature) affords it special properties for a wide variety of applications in optoelectronics, as well as high-power and high-frequency electronic devices.

GaN-based high electron mobility transistors (HEMTs) are known which feature a junction between two materials with different band gaps to form a heterojunction (or 'heterostructure'). The high electron mobility transistor (HEMT) structure is based on a very high electron mobility, described as a two-dimensional electron gas (2DEG) which forms just below a heterostructure interface between a barrier layer (that typically comprises AlGaN) on a generally intrinsic active layer (that typically comprises GaN) due to the piezoelectric effect and a natural polarization effect. As with any power field effect transistor (FET) device, there is a gate, source electrode, and drain electrode, where the source electrode and the drain electrode each include contacts that generally extend through a portion of the barrier layer to form a low resistance ohmic contact with the underlying 2DEG in the surface of the active layer.

SUMMARY

In one example, an integrated circuit (IC) is disclosed that includes a transistor on a substrate. The transistor includes a buffer structure overlying the substrate. The buffer structure has a first buffer layer, a second buffer layer overlying the first buffer layer, and a third buffer layer overlying the second buffer layer. The first buffer layer has a first carbon concentration, the second buffer layer has a second carbon concentration lower than the first carbon concentration, and the third buffer layer has a third carbon concentration higher than the second carbon concentration. An active structure overlies the buffer structure.

In another example, an IC is disclosed that includes a gallium nitride (GaN) transistor device on a substrate. The GaN transistor device includes a buffer structure overlying the substrate. The buffer structure comprises one or more base aluminum gallium nitride (AlGaN) buffer layers overlying the substrate, a first AlGaN buffer layer overlying the one or more base AlGaN buffer layers, a second AlGaN buffer layer overlying the first AlGaN buffer layer, and a GaN buffer layer overlying the second AlGaN buffer layer. The first AlGaN buffer layer has a first carbon concentration, the second AlGaN buffer layer has a second carbon concentration lower than the first carbon concentration, and the GaN buffer layer has a third carbon concentration higher than the second carbon concentration. An active structure overlies the GaN buffer layer and includes a first channel layer and a second channel layer overlying the first channel layer, where the first channel layer and the second channel layer are formed from two different materials that induce a highly-mobile 2-dimensional gas (2DEG) at their interface to form a transistor channel. A gate contact structure is disposed between a source contact and a drain contact. The gate contact structure, the source contact and the drain contact are each respectively disposed above or in contact with the transistor channel.

In yet a further example, a method of forming an integrated circuit (IC) having a transistor is disclosed. The method includes forming a first buffer layer having a first carbon concentration over a substrate, and forming a second buffer layer having a second carbon concentration lower than the first carbon concentration overlying the first buffer layer. A third buffer layer having a third carbon concentration higher than the second carbon concentration is formed over the second buffer layer, and an active structure is formed overlying the third buffer layer.

DETAILED DESCRIPTION

Figure 1:
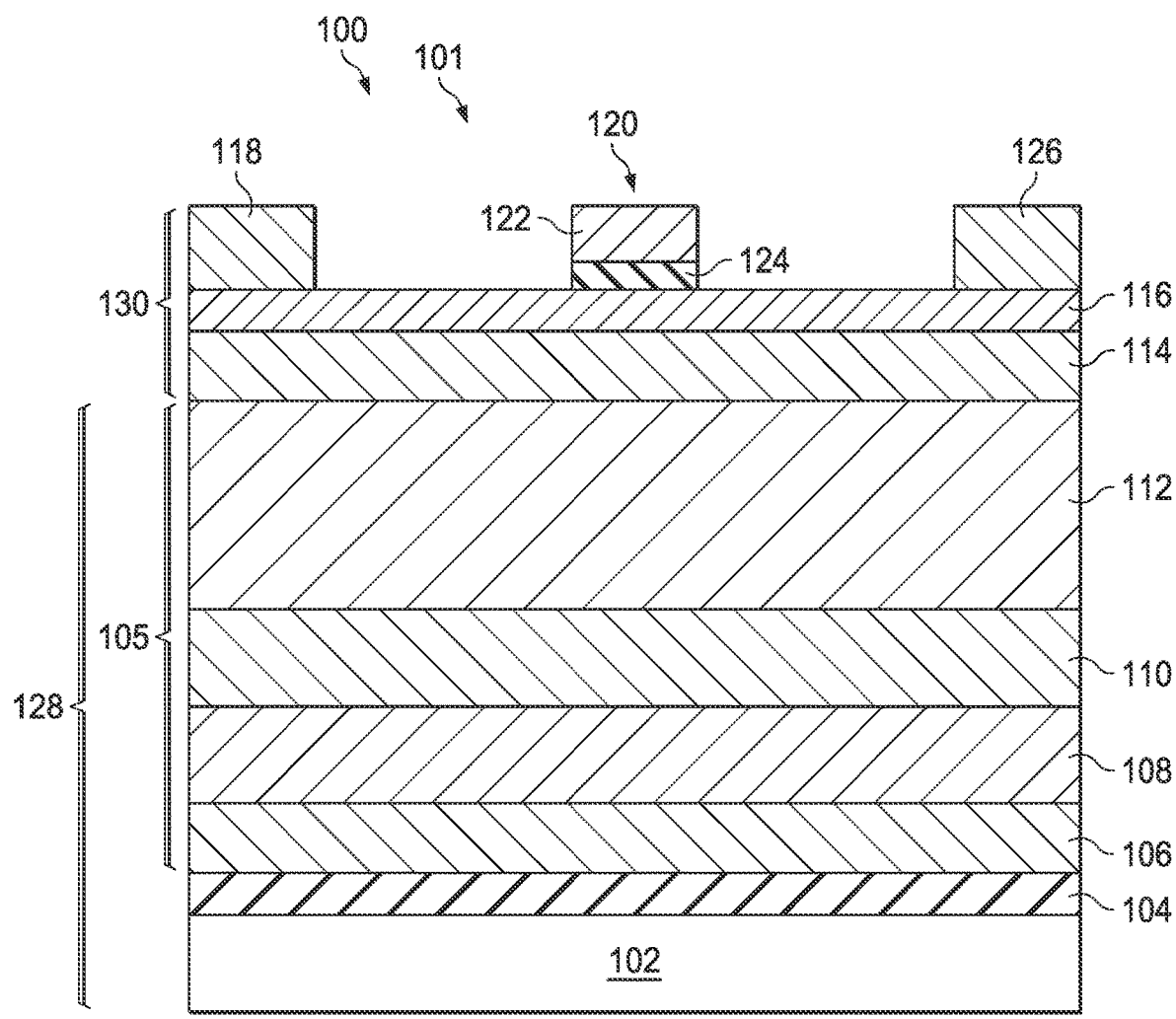
FIG. 1 illustrates a cross-sectional view of an example of a portion of an integrated circuit that includes a high electron mobility transistor (HEMT) device.

High electron mobility transistors (HEMTs) typically include a layer of highly-mobile electrons, which are induced by forming a heterostructure including a group III nitride-based alloy with broader band-gap (e.g., aluminum gallium nitride (AlGaN)) grown over another group III nitride material with a narrower bandgap (e.g., gallium nitride (GaN)). The large conduction-band offset, spontaneous polarization, and piezoelectric polarization in such a heterostructure induce a highly-mobile 2-dimensional electron gas (2DEG) at their interface, thus forming a channel of the transistor. For the sake of illustration, some of the description herein focuses on AlGaN/GaN heterostructures. However, this description is not limited to AlGaN/GaN-based heterostructures and can be applied to other heterostructures that can induce the 2DEG at their interface. Existing semiconductor fabrication techniques can be used to manufacture HEMTs using AlGaN/GaN-based heterostructures on a substrate (e.g., a semiconductor wafer).

HEMTs are fabricated such that the 2DEG is formed between the source and drain contact structures of the HEMT. A gate contact structure is generally positioned between the source and drain contact structures. HEMTs can be classified as enhancement mode HEMTs or depletion mode HEMTs. Enhancement mode HEMTs are designed such that a depletion region forms under the gate contact structure at the AlGaN/GaN interface, meaning that electrons under the gate contact structure are depleted, making enhancement mode HEMTs normally-OFF devices. Enhancement mode HEMTs can be turned ON by applying a positive threshold voltage to the gate contact structure. On the other hand, depletion mode HEMTs are designed such that the 2DEG is always present at the AlGaN/GaN interface between the source and drain contact structures, meaning that depletion mode HEMTs are normally-ON devices. Depletion mode HEMTs are turned OFF by applying a negative threshold voltage to the gate contact structure.

In high-voltage (e.g., operating voltage over 500V) applications, both enhancement and depletion mode HEMTs suffer from a back gating effect in that the high voltage between the drain of the device and the substrate depletes the channel. Therefore, a buffer structure or stack formed of multiple epitaxial layers is fabricated between the substrate and the channel formed by the 2DEG. The buffer needs to be relatively thick and resistive/capacitive enough to provide the necessary isolation and handle the high voltage applied between the drain and the substrate. The buffers of the GaN HEMTs typically require carbon doping to create current collapse reliability issues. That is GaN due to its natural impurities, such as Oxygen and/or Nitrogen, results in a n-type behavior. Carbon behaves as an acceptor resulting in the GaN behaving as a p-type device mitigating current collapse. However, excessive doping can result in vertical leakage issues in the buffer structure.

Accordingly, at least some of the examples disclosed herein are directed towards an HEMT with a modulated carbon concentration profile through the buffer structure in order to maintain both low vertical leakage and improved back gating behavior. At least some of the examples are directed towards GaN-based HEMTs. Increasing carbon within a buffer layer of GaN increases the resistance and capacitance of the respective layer. By modulating the carbon within the buffer layers of the buffer structure, a device with lower vertical leakage and improved back gating behavior is obtained. Other types of GaN type devices with a buffer structure could employ the modulated carbon concentration profile.

In one example, a first buffer layer has a first carbon concentration, a second buffer layer overlying the first buffer layer has a second carbon concentration, and a third buffer layer overlying the second buffer layer has a third carbon concentration, wherein the second carbon concentration is less than the first carbon concentration, and the third carbon concentration is greater than the second carbon concentration to provide a saw tooth carbon concentration profile. In a further example, the first buffer layer is formed of AlGaN, the second buffer layer is formed of AlGaN and the third buffer layer is formed of GaN.

FIG. 1 illustrates a cross-sectional view of an example of a portion of an integrated circuit 100 that includes a HEMT device 101. The HEMT device 101 includes an active structure 130 overlying a base structure 128. The base structure 128 can comprise a substrate layer 102, a nucleation layer 104 and a buffer structure 105. The substrate layer 102 can comprise silicon carbide (SiC), sapphire, silicon crystal or any other appropriate substrate layer materials. The nucleation layer 104 can be formed of one or more aluminum nitride (AlN) layers or any other appropriate nucleation layer or layers. The buffer structure 105 can be an epitaxial stack formed of a plurality of aluminum gallium nitride (AlGaN) layers with a gallium nitride (GaN) layer cap. The buffer structure 105 can comprise a series of discrete AlGaN layers (typically between two and eight layers), each discrete layer having a different aluminum composition.

As far as the relative percentages between aluminum and gallium, the percentage of aluminum in the each of the plurality of AlGaN layers can range from about 0.1 to 100 percent (i.e., AlxGa1-xN, where x=0.001 to 1). For example, the percentage of aluminum in each of the plurality of AlGaN layers can be between about 20% and 100% aluminum-content aluminum gallium nitride. The plurality of AlGaN layers can be graded or non-graded. In one example, the plurality of AlGaN layers are graded, the term "graded" being used to denote the process of gradually changing the percentage of aluminum to its specified percentage, relative to the percentage of gallium.

In one example, the plurality of AlGaN layers includes one or more base AlGaN buffer layers 106 overlying the nucleation layer 104, a first AlGaN buffer layer 108 overlying the one or more base AlGaN buffer layers 106, and a second AlGaN buffer layer 110 overlying the first AlGaN buffer layer 108. A GaN cap buffer layer 112 overlies the second AlGaN buffer layer 110. As previously stated, the plurality of AlGaN layers can be graded. For example, the one or more base AlGaN buffer layers 106 can contain 75% aluminum, the first AlGaN buffer layer 108 can contain 50% aluminum and the second AlGaN buffer layer 110 can contain 25% aluminum. The varying of aluminum content facilitates strain management due to the different lattice structure of the GaN cap buffer layer 112 relative to AlGaN buffer layers. The thickness of each of the plurality of AlGaN buffer layers and the GaN cap buffer layer 112 are selected to provide the appropriate support to handle the voltage across the HEMT device 101.

The active structure 130 overlies the buffer structure 105 and includes a single heterostructure of an AlGaN channel layer 116 overlying a GaN channel layer 114. A channel is formed from the interface between the AlGaN channel layer 116 and the GaN channel layer 114. Although the present example is illustrated with respect to employing a layer of AlGaN overlying a layer of GaN to form a heterostructure, a variety of heterostructures could be employed as long as the heterostructure comprises two layers of dissimilar materials designed to create a sheet of electrons (i.e. a 2DEG channel) or a sheet of holes (i.e., a 2DHG channel) at the interface between the two dissimilar materials. Various heterostructure materials are known to produce 2DEG and 2DHG channels at the interface therebetween, including but not limited to Aluminum Gallium Nitride (AlGaN) and Gallium Nitride (GaN), Aluminum Gallium Arsenide (AlGaAs) and Gallium Arsenide (GaAs), Indium Aluminum Nitride (InAlN) and Gallium Nitride (GaN), alloys of Silicon (Si) and Germanium (Ge), and noncentrosymmetric oxidesheterojunction overlying a buffer structure.

A gate contact structure 120 resides between a source contact 118 and a drain contact 126 each overlying the AlGaN channel layer 116. The gate contact structure 120 includes a gate barrier 124 (e.g., silicon nitride) disposed between a gate contact 122 and the AlGaN layer 116. The gate contact 122, the drain contact 118 and the source contact 126 can be formed of gold, nickel or some other contact material. The gate contact structure 120 controls the turning off and on of the HEMT device, and thus the current flowing between the source contact 118 and the drain contact 126. In this example, the HEMT device 101 is a depletion mode device that is normally on, unless a negative bias is applied at the gate contact 122 to turn the device off. The present example is illustrated with the gate contact structure 120, the drain contact 118 and the source contact 126 residing directly on the AlGaN, however, the gate contact structure 120, the drain contact 118 and the source contact 126 can each be configured respectively in a variety of different transistor configuration in which the contacts are embedded in the AlGaN layer 116 and/or disposed on other layers positioned in between one or more of the gate contact structure 120, the source contact 118 and the drain contact 126.

In the example of FIG. 1, the carbon concentration is modulated through different layers of the buffer structure 105 to provide lower vertical leakage and improved back gating behavior. For example, the first AlGaN buffer layer 108 is doped with carbon to have a first carbon concentration, the second AlGan buffer layer 110 is doped with carbon to have a second carbon concentration, and the GaN cap buffer layer 112 is doped with a third carbon concentration, wherein the first carbon concentration is greater than the second carbon concentration, and the second carbon concentration is less than the third carbon concentration to provide a saw tooth carbon concentration profile through the buffer structure 105.

Figure 2:
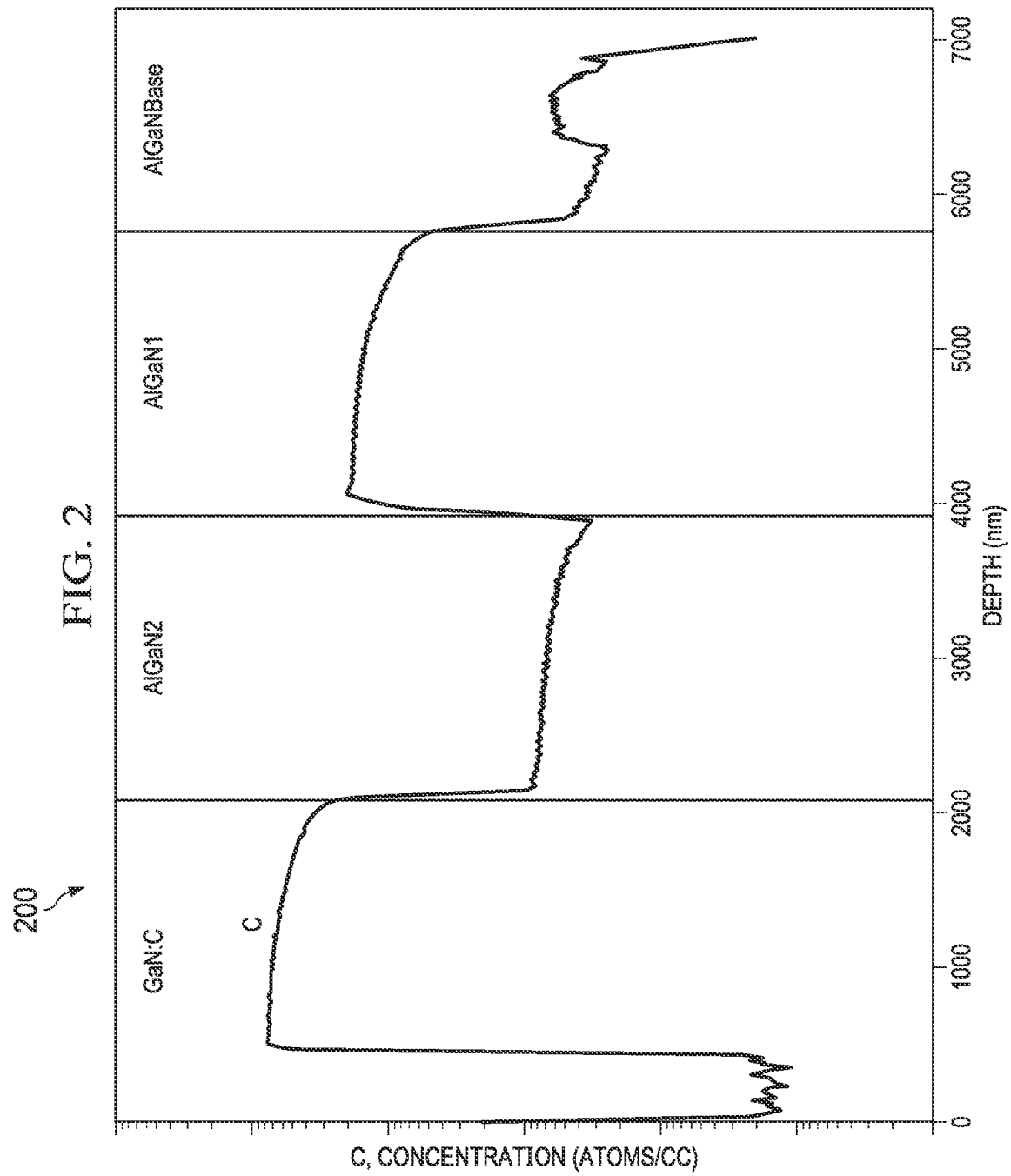
FIG. 2 illustrates a graph of atom concentration (atoms/cubic centimeter) versus device depth (nm) of one example of a modulated carbon profile for a HEMT device.

FIG. 2 illustrates a graph 200 of atom concentration (atoms/cubic centimeter) versus device depth (nm) of one example of a modulated carbon profile for a HEMT device, such as the one shown in FIG. 1. As illustrated in the graph 200 from the bottom of the HEMT to the top of the HEMT, a base AlGaN buffer layer has a baseline concentration. The carbon concentration is then stepped up in a first AlGaN buffer layer to a first carbon concentration higher than the baseline concentration. The carbon concentration is then stepped down in a second AlGaN buffer layer to a second carbon concentration lower than the first carbon concentration. The carbon concentration is then stepped up in a GaN cap buffer layer to a third carbon concentration that is higher than the second carbon concentration. This is but one example of modulating carbon concentrations within different layers of a buffer structure of a HEMT, and a variety of different modulating concentration and buffer layers can be selected based on a particular application.

Figure 3:
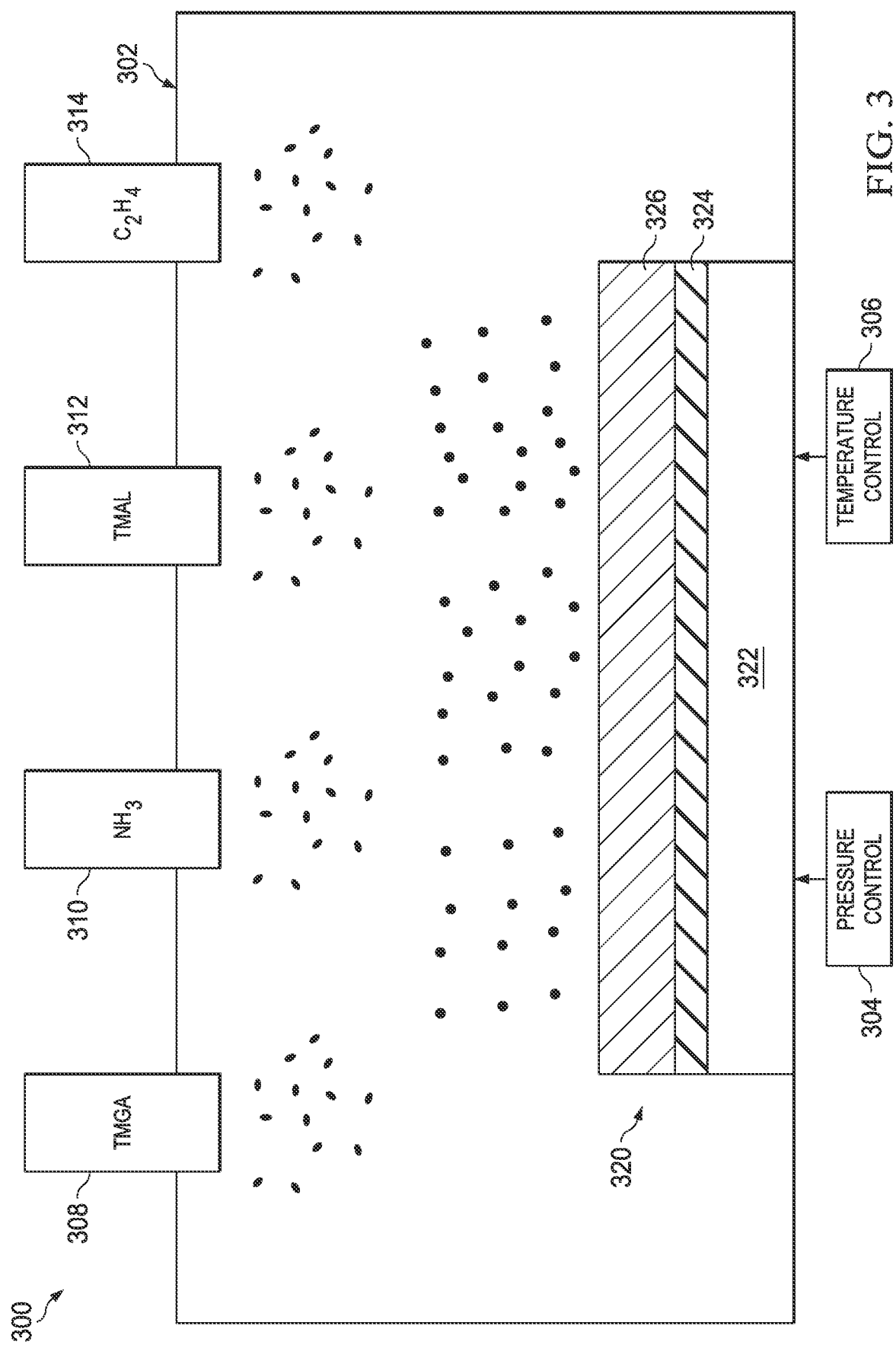
FIG. 3 illustrates a schematic diagram of an example of a deposition system having a deposition chamber for building buffer layers of a buffer structure of a HEMT device.

FIG. 3 illustrates a schematic diagram of an example of a deposition system 300 having a deposition chamber 302 for building buffer layers of the buffer structure. The deposition system 300 includes a pressure control 304, a temperature control 306 and a plurality of gas sources. The plurality of gas sources includes a number of intrinsic gas source including Trimethylamine Gallium (TMG) source 308, an ammonia source ($NH_3$) 310, a Trimethylamine Aluminum (TMA) source 312 and an extrinsic source of an additional carbon source of ethene ($C_2H_4$) 314. Although the present examples have been illustrated employing ethene ($C_2H_4$) as the additional carbon source, a variety of other hydrocarbon sources could be employed to provide the desired additional carbon doping, such as methane ($CH_4$), acetylene ($C_2H_2$), propane ($C_3H_8$), iso-butane (i-$C_4H_{10}$) and trimethylamine ($N(CH_3)_3$). The deposition system 300 is configured to provide the selected gases at respective controlled flow rates to form different AlGaN layers and GaN layers with different carbon concentrations. For example, the TMG and the ammonia can be combined to form a GaN layer with a given carbon concentration. The TMG, the TMA and the ammonia can be combined to form an AlGaN layer with a respective baseline carbon concentration. The additional carbon source of ethene can be turned on at a respective controlled flow rate to increase the carbon concentration and provide an AlGaN layer or GaN layer at a given concentration that is higher than the baseline carbon concentration when the additional carbon source is not turned on. In this manner the carbon concentration throughout the buffer structure can be modulated between alternating lower and higher carbon concentrations.

In the example of FIG. 3, a partially fabricated HEMT 320 resides in the deposition chamber 302 and includes a silicon nitride layer 324 overlying a substrate layer 322 and one or more base AlGaN buffer layers 326 overlying the silicon nitride layer 324. Each of the TMG source 308, the ammonia source ($NH_3$) 310, the TMA source 312 and the additional carbon source of ethene ($C_2H_4$) 314 are turned on to provide respective gases at respective flow rates to form a first AlGaN buffer layer (not shown) overlying the one or more base AlGaN layers 326. The first AlGaN buffer layer is configured to have a carbon concentration higher than the baseline of the one or more base AlGaN buffer layers 326. Although not shown, in subsequent processes, a second AlGaN buffer layer is formed over the first AlGaN buffer layer with the additional carbon source 314 turned off. Additionally, the TMA source can be then turned off and the additional carbon source 314 turned on to form a GaN cap buffer layer overlying the second AlGaN buffer layer with a higher carbon concentration than the carbon concentration of the second AlGaN buffer layer to provide a modulated carbon concentration through the buffer structure. It is to be appreciated that other gas sources or different gas sources besides the TMG source, the TMA source, the ammonia source and the additional carbon source of ethene ($C_2H_4$) could be employed to form the AlGaN layers and GaN layers with a modulated carbon concentration profile.

Figure 4:
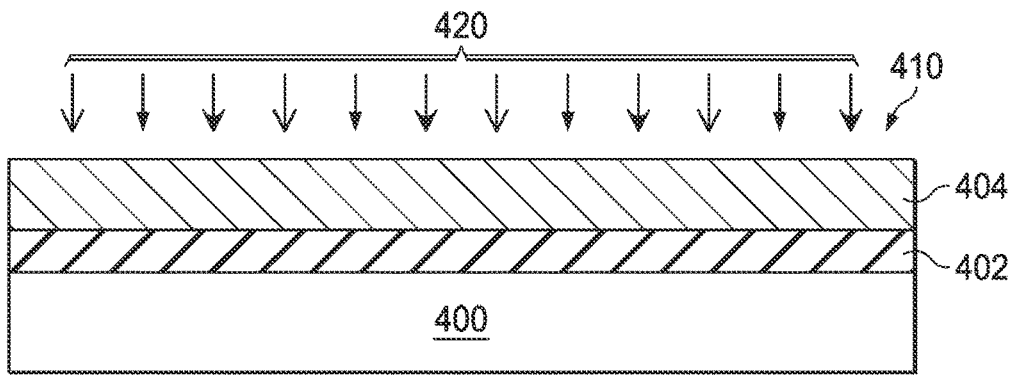
FIG. 4 illustrates a cross-sectional view of a partially fabricated HEMT in its early stages of fabrication while undergoing a deposition process.

Turning now to FIGS. 4-9, fabrication is discussed in connection with formation of an example HEMT similar to the HEMT shown in FIG. 1. FIG. 4 illustrates a cross-sectional view of a partially fabricated HEMT 410 in its early stages of fabrication. The partially fabricated HEMT 410 includes a silicon nitride layer 402 overlying a substrate layer 400 and one or more base AlGaN buffer layers 404 overlying the silicon nitride layer 402 residing in a deposition chamber as shown in FIG. 3. The underlying substrate layer 400 can be, for example, a silicon or glass wafer that provides mechanical support for the subsequent overlying layers. Any suitable technique for forming the silicon nitride layer 402 may be employed such as Low Pressure Chemical Vapor Deposition (LPCVD), Plasma Enhanced Chemical Vapor Deposition (PECVD), High Density Plasma Chemical Vapor Deposition (HDPCVD), sputtering or spin-on techniques. The one or more base AlGaN buffer layers 404 can be formed by flowing a combination of TMG, TMA and ammonia gases. The one or more base AlGaN buffer layers 404 have a respective baseline carbon concentration.

For example, the deposition chamber can undergo and in-situ cleaning prior to disposing the substrate into the deposition chamber. The in-situ cleaning can be performed within the ranges of about 5 minutes to about 15 minutes at a temperature of about 750° C. to about 1250° C. at a pressure of about 35 millimeter bars (mmbars) to about 65 mmbars. The silicon nitride layer 402 can be formed above one or more other nucleation layers, such as a high temperature aluminum nitride layer overlying a low temperature aluminum nitride layer. The silicon nitride layer 402 can be formed by concurrently flowing TMA within the ranges from about 400 stand cubic centimeters (sccm) to about 750 sccm and ammonia at about 1200 sccm to about 1700 sccm for about 25 minutes to about 45 minutes at a temperature of about 850° C. to about 1300° C. at a pressure of about 35 mmbars to about 65 mm bars. The one or more base AlGaN buffer layers 404 can be formed by concurrently flowing TMA within the ranges from about 550 sccm to about 850 sccm, TMG from about 50 sccm to about 75 sccm and ammonia at about 3500 sccm to about 6000 sccm for about 20 minutes to about 30 minutes at a temperature of about 850° C. to about 1300° C. at a pressure of about 35 mmbars to about 65 mmbars.

FIG. 4 also illustrates the partially fabricated HEMT 410 undergoing a deposition process 420. The deposition process 420 includes flowing a combination of TMG, TMA, ammonia and an additional carbon source of, for example, ethene ($C_2H_4$) gases to form a first AlGaN buffer layer 500 over the one or more base AlGaN buffer layers 404, and provide the resultant structure of FIG. 5. The first AlGaN buffer layer 500 has a first carbon concentration higher than the baseline carbon concentration of the one or more base AlGaN buffer layers 404. The first AlGaN buffer layer 500 can be formed by concurrently flowing TMA within the ranges from about 750 sccm to about 1200 sccm, TMG from about 100 sccm to about 200 sccm, ethene from about 100 sccm to about 200 sccm, and ammonia flowing at about 2000 sccm to about 3500 sccm for about 40 minutes to about 65 minutes at a temperature of about 850° C. to about 1300° C. at a pressure of about 35 mm bars to about 65 mm bars.

Figure 5:
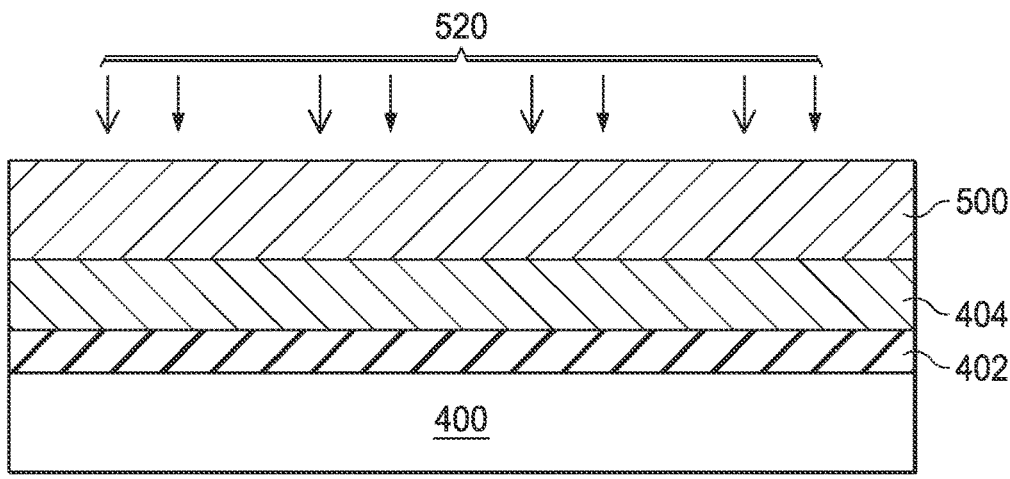
FIG. 5 illustrates the partially fabricated HEMT of FIG. 4 after the deposition process and while undergoing a subsequent deposition process.

FIG. 5 also illustrates the partially fabricated HEMT undergoing a subsequent deposition process 520. In the deposition process 520 shown in FIG. 5, the additional carbon source is turned off. A second AlGaN buffer layer 600 is formed over the first AlGaN buffer layer 500 by flowing a combination of TMG, TMA, and ammonia gases to form the second AlGaN buffer layer 600 having a second carbon concentration lower than the first carbon concentration of the first AlGaN buffer layer 500 to provide the resultant structure of FIG. 6. The second AlGaN buffer layer 600 can be formed by concurrently flowing TMA within the ranges from about 400 sccm to about 600 sccm, TMG from about 150 sccm to about 275 sccm, and ammonia at about 2000 sccm to about 3500 sccm for about 45 minutes to about 75 minutes at a temperature of about 850° C. to about 1300° C. at a pressure of about 35 mmbars to about 65 mm bars.

Figure 6:
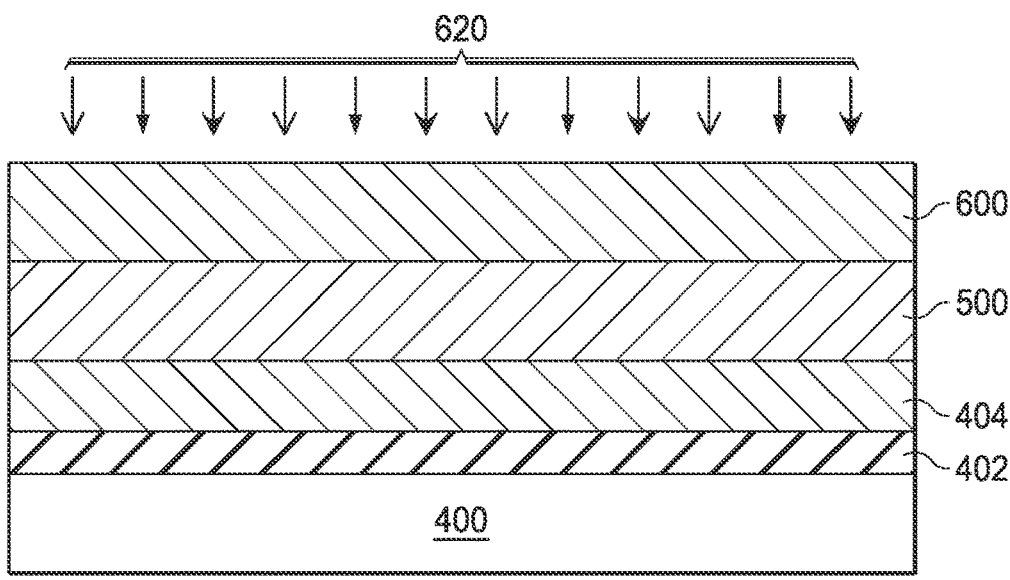
FIG. 6 illustrates the partially fabricated HEMT of FIG. 5 after the subsequent deposition process and while undergoing an additional deposition process.
Figure 7:
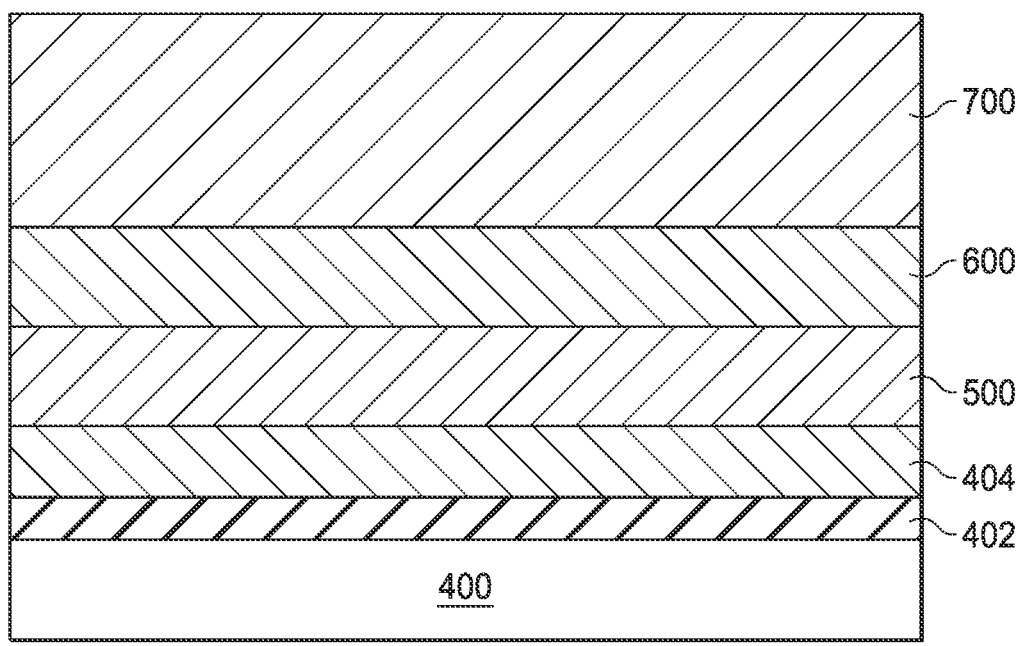
FIG. 7 illustrates the partially fabricated HEMT of FIG. 6 after undergoing the additional deposition process.

Next, the partially fabricated HEMT of FIG. 6 undergoes yet another subsequent deposition process 620. In the deposition process 620 shown in FIG. 6, the additional carbon source is turned on again. A GaN cap buffer layer 700 is formed overlying the second AlGaN buffer layer 600 by flowing a combination of TMG, ammonia and the additional carbon source to form the GaN cap buffer layer 700 having a third carbon concentration higher than the second carbon concentration of the second AlGaN buffer layer 600 to provide the resultant structure of FIG. 7. The structure of FIG. 7 illustrates a completed buffer structure. The GaN cap buffer layer 700 can be formed by concurrently flowing TMG from about 350 sccm to about 550 sccm, ethene from about 1300 sccm to about 2000 sccm, and ammonia at about 15000 sccm to about 25000 sccm for about 20 minutes to about 45 minutes at a temperature of about 800° C. to about 1300° C. at a pressure of about 150 mmbars to about 250 mmbars.

Figure 8:
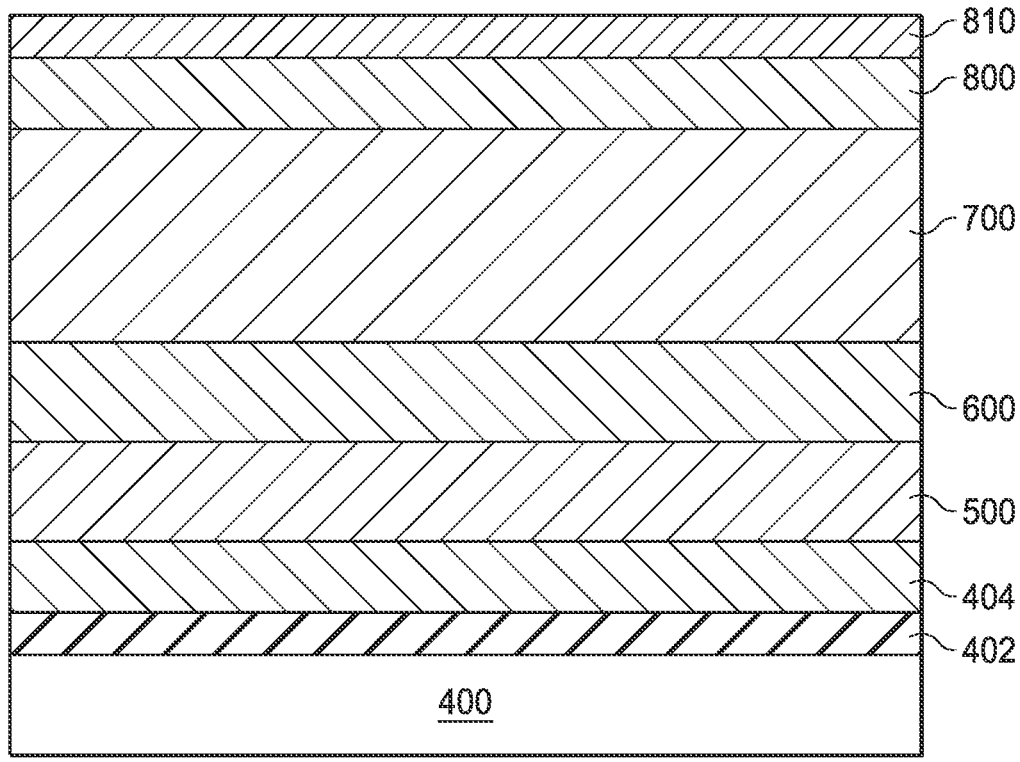
FIG. 8 illustrates the partially fabricated HEMT of FIG. 7 after formation of an active structure overlying the buffer structure.

FIG. 8 illustrates the partially fabricated HEMT after formation of an active structure overlying the buffer structure. The active structure includes a GaN channel layer 800 overlying the GaN cap buffer layer 700 and an AlGaN channel layer 810 overlying the GaN channel layer 800. The AlGaN channel layer 810 and the GaN channel layer 800 can be fabricated without any carbon concentrations and in different deposition chambers than the one used to form the modulated carbon buffer layers in the buffer structure. An active channel is formed at the interface of the AlGaN channel layer 810 and the GaN channel layer 800 as previously discussed. Any suitable technique for forming the AlGaN channel layer 810 and the GaN channel layer 800 may be employed such as LPCVD, PECVD, HDPCVD, sputtering or spin-on techniques.

The GaN channel layer 800 can be formed by concurrently flowing TMG from about 150 sccm to about 250 sccm, and ammonia at about 25000 sccm to about 40000 sccm for about 10 minutes to about 25 minutes at a temperature of about 800° C. to about 1300° C. at a pressure of about 150 mmbars to about 250 mmbars. The AlGaN channel layer 810 can be formed by concurrently flowing TMA within the ranges from about 75 sccm to about 160 sccm, TMG from about 40 sccm to about 65 sccm and ammonia at about 7000 sccm to about 11000 sccm for about 2 minutes to about 3 minutes at a temperature of about 800° C. to about 1250° C. at a pressure of about 50 mmbars to about 100 mmbars.

Figure 9:
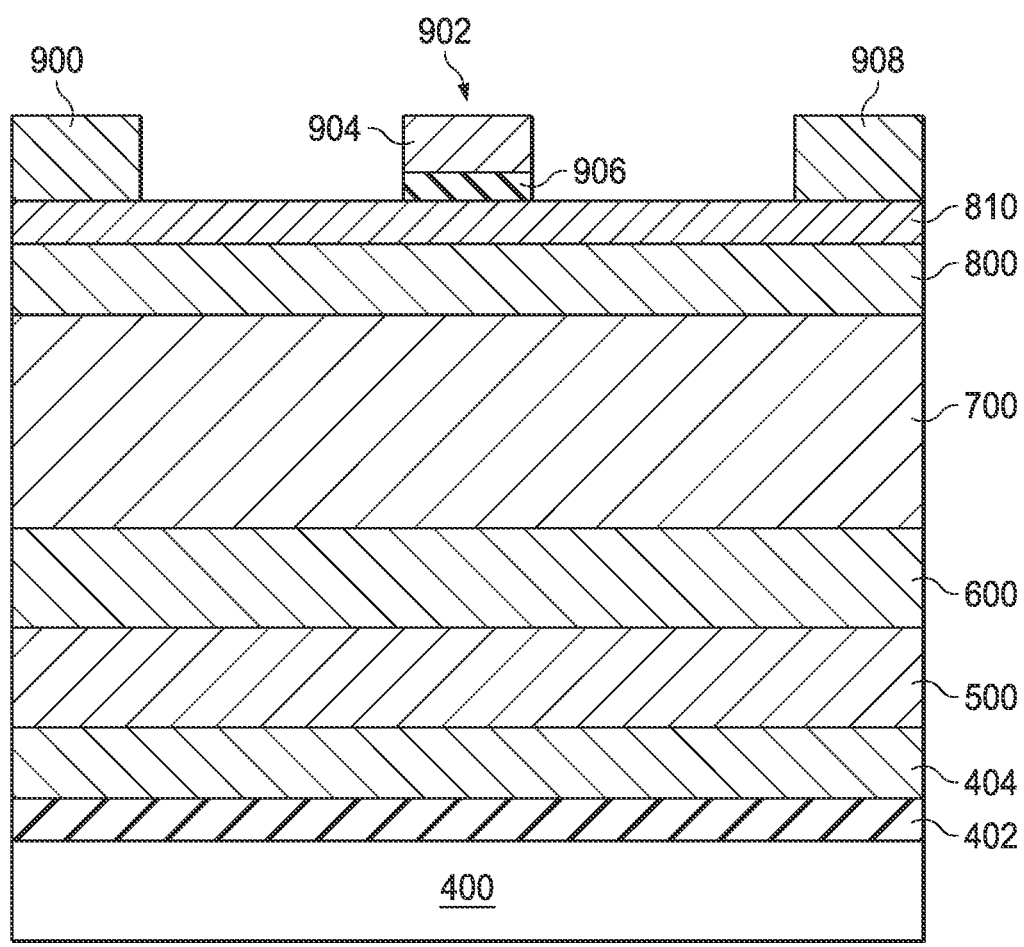
FIG. 9 illustrates a fabricated HEMT after formation of a drain contact, a source contact and a gate contact structure on the partially fabricated HEMT of FIG. 8.

FIG. 9 illustrates a fabricated HEMT after formation of a drain contact 900, a source contact 908 and a gate structure 902. The gate contact structure 902 resides between the source contact 900 and the drain contact 908 with each overlying the AlGaN channel layer 810. The gate contact structure 902 includes a gate barrier 906 (e.g., silicon nitride) disposed between a gate contact 904 and the AlGaN channel layer 810. The gate barrier 906 can be formed by depositing a gate barrier material layer over the AlGaN channel layer 810, covering and patterning a photoresist material layer overlying the gate barrier material layer to protect the barrier material layer at the gate contact location, and performing an etch of the gate barrier to remove the gate barrier material layer everywhere but the gate contact location. The photoresist material layer can then be stripped to leave the gate barrier 906 at the gate contact location. The gate contact 904, the drain contact 900, and the source contact 908 can be formed of gold, nickel or some other contact material. A gate contact material layer can be formed by depositing a gate contact material layer over the AlGaN channel layer 810 and the gate barrier 906 and repeating the process of depositing a photoresist material layer, patterning, etching and stripping the remaining photoresist material to leave the source contact 900, the drain contact 908 and a gate contact 906 overlying the gate barrier 906.

For purposes of simplification of explanation the terms "overlay", "overlaying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming an integrated circuit (IC) having a transistor, the method comprising:
   forming a first buffer layer having a first carbon concentration over a substrate;
   forming a second buffer layer having a second carbon concentration lower than the first carbon concentration over the first buffer layer;
   forming a third buffer layer having a third carbon concentration higher than the second carbon concentration over the second buffer layer; and
   forming an active structure overlying the third buffer layer.

2. The method of 1, wherein forming the first buffer layer comprises concurrently injecting gases from an aluminum gas source, a gallium gas source and an ammonia gas source at respective flow rates to form a first aluminum gallium nitride (AlGaN) buffer layer having the first carbon concentration, wherein the carbon is injected intrinsically from the aluminum gas source and/or the gallium gas source, and extrinsically from an additional carbon gas source.

3. The method of 2, wherein forming the second buffer layer comprises concurrently injecting gases from the aluminum gas source, the gallium gas source and the ammonia gas source at respective flow rates to form a second AlGaN buffer layer having the second carbon concentration, wherein the carbon is injected intrinsically from the aluminum gas source and/or the gallium gas source.

4. The method of 3, wherein forming the third buffer layer comprises concurrently injecting gases from the gallium gas source and the ammonia gas source at respective flow rates to form a gallium nitride (GaN) buffer layer having the third carbon concentration, wherein the carbon is injected intrinsically from the gallium gas source and extrinsically from the additional carbon gas source.

5. The method of 4, wherein the aluminum gas source is Trimethylamine Aluminum (TMA), the gallium gas source is Trimethylamine Gallium (TMG), and the additional carbon gas source is one of ethene (C2H4), methane (CH4), acetylene (C2H2), propane (C3H8), iso-butane (i-C4H10) and trimethylamine (N(CH3)3).

6. The method of claim 5, further comprising forming one or more base AlGaN buffer layers, over the substrate, having a baseline carbon concentration that is lower than the first carbon concentration prior to forming of the first AlGaN buffer layer.

7. The method of claim 1, wherein forming the active structure comprises forming a first channel layer overlying the third buffer layer and a second channel layer overlying the first channel layer, the first channel layer and the second channel layer being formed from two different materials that induce a highly-mobile 2-dimensional gas (2DEG) at their interface to form a transistor channel.

8. The method of claim 7, wherein the first channel layer is a gallium nitride (GaN) channel layer and the second channel layer is an aluminum gallium nitride (AlGaN) channel layer.

9. The method of claim 7, further comprising forming a gate contact structure, a source contact and a drain contact each overlying or in contact with the second channel layer, the gate contact structure being disposed between the source contact and the drain contact.

10. A method of forming an integrated circuit (IC) having a Gallium Nitride (GaN) transistor device on a substrate, comprising:
    forming a buffer structure overlying the substrate, the buffer structure comprising a base aluminum gallium nitride (AlGaN) buffer layer overlying the substrate, a first AlGaN buffer layer overlying the base AlGaN buffer layer, and a second AlGaN buffer layer overlying the first AlGaN buffer layer, a gallium nitride (GaN) buffer layer overlying the second AlGaN buffer layer, the first AlGaN buffer layer having a first carbon concentration, the second AlGaN buffer layer having a second carbon concentration lower than the first carbon concentration, and the GaN buffer layer having a third carbon concentration higher than the second carbon concentration; and
    forming an active structure overlying the buffer structure and comprising a first channel layer and a second channel layer overlying the first channel layer, the first channel layer and the second channel layer being formed from two different materials that induce a highly-mobile 2-dimensional gas (2DEG) at their interface to form a transistor channel, and a gate contact structure disposed between a source contact and a drain contact, the gate contact structure, the source contact and the drain contact each being respectively disposed above or in contact with the transistor channel.

11. The method of claim 10, wherein the first channel layer is a GaN channel layer and the second channel layer is an AlGaN channel layer.

12. The method of claim 10, wherein the substrate is a silicon substrate and further comprising an aluminum nitride layer disposed over the silicon substrate.

13. A method of forming an integrated circuit (IC) having a Gallium Nitride (GaN) transistor device on a substrate, comprising:
    forming a base aluminum gallium nitride (AlGaN) buffer layer overlying the substrate;
    forming a first AlGaN buffer layer overlying the base AlGaN buffer layer, the first AlGaN buffer layer having a first carbon concentration;
    forming a second AlGaN buffer layer overlying the first AlGaN buffer layer, the second AlGaN buffer layer having a second carbon concentration lower than the first carbon concentration;
    forming a gallium nitride (GaN) buffer layer overlying the second AlGaN buffer layer, the GaN buffer layer having a third carbon concentration higher than the second carbon concentration; and
    forming an active structure overlying the GaN buffer layer.

14. The method of claim 13, wherein forming the active structure comprises:
    forming a first channel layer;
    forming a second channel layer overlying the first channel layer, the first channel layer and the second channel layer being formed from two different materials that induce a highly-mobile 2-dimensional gas (2DEG) at their interface to form a transistor channel; and forming a gate contact structure disposed between a source contact and a drain contact, the gate contact structure, the source contact and the drain contact each being respectively disposed above or in contact with the second channel layer.

15. The method of claim 14, wherein the first channel layer is a GaN channel layer and the second channel layer is an AlGaN channel layer.

16. The method of claim 13, wherein the substrate is a silicon substrate and further comprising an aluminum nitride layer disposed over the silicon substrate.

17. The method of 13, wherein forming the first AlGaN buffer layer comprises concurrently injecting gases from an aluminum gas source, a gallium gas source and an ammonia gas source, wherein the carbon is injected intrinsically from the aluminum gas source and/or the gallium gas source, and extrinsically from an additional carbon gas source.

18. The method of 17, wherein forming the second AlGaN buffer layer comprises concurrently injecting gases from the aluminum gas source, the gallium gas source and the ammonia gas source, wherein the carbon is injected intrinsically from the aluminum gas source and/or the gallium gas source.

19. The method of 18, wherein forming the GaN buffer layer comprises concurrently injecting gases from the gallium gas source and the ammonia gas source, wherein the carbon is injected intrinsically from the gallium gas source and extrinsically from the additional carbon gas source.

20. The method of 19, wherein the aluminum gas source is Trimethylamine Aluminum (TMA), the gallium gas source is Trimethylamine Gallium (TMG), and the additional carbon gas source is one of ethene (C2H4), methane (CH4), acetylene (C2H2), propane (C3H8), iso-butane (i-C4H10) and trimethylamine (N(CH3)3).

* * * * *